(12) United States Patent
Ihara et al.

(10) Patent No.: US 8,243,457 B2
(45) Date of Patent: Aug. 14, 2012

(54) ELECTRONIC COMPONENT MOUNTING STRUCTURE, ELECTRONIC DEVICE AND MANUFACTURING METHOD OF AN ELECTRONIC DEVICE

(75) Inventors: Akio Ihara, Hachioji (JP); Yutaka Nakamura, Kokubunji (JP); Hirohisa Tokunaga, Kunitachi (JP); Kuniaki Imamiya, Tokyo (JP)

(73) Assignee: Fujitsu Toshiba Mobile Communications Limited, Kawasaki (JP)

( * ) Notice: Subject to any disclaimer, the term of this patent is extended or adjusted under 35 U.S.C. 154(b) by 339 days.

(21) Appl. No.: 12/556,772

(22) Filed: Sep. 10, 2009

(65) Prior Publication Data
US 2010/0254101 A1 Oct. 7, 2010

(30) Foreign Application Priority Data
Apr. 7, 2009 (JP) ................ P2009-092653

(51) Int. Cl.
*H05K 5/00* (2006.01)
*H05K 1/00* (2006.01)
*H05K 7/02* (2006.01)
(52) U.S. Cl. ......... 361/752; 361/751; 361/807; 361/810
(58) Field of Classification Search ........... 343/700 MS, 343/702; 361/752, 800, 807, 810, 749, 751; 455/575.1, 575.7
See application file for complete search history.

(56) References Cited

U.S. PATENT DOCUMENTS

| | | | |
|---|---|---|---|
| 5,731,964 A * | 3/1998 | Kitakubo et al. | 361/816 |
| 7,239,899 B2 * | 7/2007 | Lin | 455/575.1 |
| 2002/0154765 A1 * | 10/2002 | Suzuki et al. | 379/433.01 |
| 2004/0082211 A1 * | 4/2004 | Hsieh | 439/329 |
| 2006/0104469 A1 * | 5/2006 | Hawker et al. | 381/365 |
| 2007/0126397 A1 * | 6/2007 | Kogan et al. | 320/112 |
| 2008/0165067 A1 * | 7/2008 | Kim | 343/702 |
| 2008/0291647 A1 * | 11/2008 | Hirota et al. | 361/752 |

FOREIGN PATENT DOCUMENTS
JP 2003-318569 A 11/2003
* cited by examiner

*Primary Examiner* — Timothy Thompson
*Assistant Examiner* — Sherman Ng
(74) *Attorney, Agent, or Firm* — Maschoff Gilmore & Israelsen

(57) ABSTRACT

An electronic component mounting structure includes: a casing provided with an accommodating portion, an insertion opening formed at outside of the accommodating portion, and a threaded hole to which a screw is fastened; an electronic component including a contact terminal having elasticity; a printed circuit board having a conductor layer electrically connectable to the contact terminal; and a fixing plate provided with a fitting portion configured to fit into the insertion opening, and a screw insertion hole through which the screw is inserted, and configured to fix the printed circuit board. In the accommodating portion, the fixing plate is disposed on the printed circuit board, and the printed circuit board is disposed on the electronic component. The fixing plate is fixed to the casing by the screw inserted through the screw insertion hole in a state where the fitting portion is fitted into the insertion opening.

15 Claims, 4 Drawing Sheets

ELECTRONIC COMPONENT MOUNTING STRUCTURE, ELECTRONIC DEVICE AND MANUFACTURING METHOD OF AN ELECTRONIC DEVICE

CROSS-REFERENCE TO RELATED APPLICATIONS

The entire disclosure of Japanese Patent Application No. 2009-092653 filed on Apr. 7, 2009, including specification, claims, drawings and abstract is incorporated herein by reference in its entirety.

BACKGROUND

1. Field of the Invention

An aspect of the present invention relates to an electronic component mounting structure for mounting an electronic component including a contact terminal having elasticity for an electronic device, and an associated component to a casing. Another aspect of the present invention relates to an electronic device and a manufacturing method of an electronic device.

2. Description of the Related Art

For example, various electronic components such as a receiver, a speaker, and a vibrator are accommodated in a casing of an electronic device such as a mobile phone. In addition, a printed circuit board is accommodated in the casing, and a contact terminal of the electronic component and the printed circuit board are electrically connected to each other.

There is an electronic component provided with a contact terminal having elasticity to obtain sufficient contact pressure with the printed circuit board (see JP-A-2003-318569, for instance). When the electronic device is assembled, the contact terminal and a conductor layer provided in the printed circuit board need to be reliably brought into contact with each other and to be accommodated in the casing.

There maybe a case where the printed circuit board stacked on the electronic component cannot endure the contact pressure with the contact terminal of the electronic component, so that sufficient contact pressure cannot be obtained. In this case, for example, by additionally stacking a thin plate for fixing which can be mounted in the casing, it is possible to reinforce the printed circuit board in the contact direction.

During an operation of mounting the electronic component, the printed circuit board, and the thin plate for fixing in the casing, it is necessary to reliably bring the contact terminal and the conductor layer into contact with each other for the mounting. Here, when the electronic component is accommodated in the casing and the printed circuit board is additionally stacked thereon, the printed circuit board rises upward due to the elasticity of the contact terminal. In this situation, the operation of maintaining a state where the contact terminal and the conductor layer are disposed at suitable positions while mounting the thin plate for fixing is difficult.

In addition, there maybe a case where the contact terminal is deformed during the mounting when the thin plate for fixing is mounted without checking the state where the contact terminal and the conductor layer are disposed at suitable positions.

SUMMARY

There is provided an electronic component mounting structure including: a casing provided with an accommodating portion, an insertion opening formed at outside of the accommodating portion, and a threaded hole to which a screw is fastened; an electronic component including a contact terminal having elasticity; a printed circuit board having a conductor layer electrically connectable to the contact terminal; and a fixing plate provided with a first fitting portion configured to fit into the insertion opening, and a screw insertion hole through which the screw is inserted, and configured to fix the printed circuit board in a connection direction of the contact terminal, wherein: in the accommodating portion, the fixing plate is disposed on the printed circuit board, and the printed circuit board is disposed on the electronic component, and the fixing plate is fixed to the casing by the screw inserted through the screw insertion hole in a state where the first fitting portion is fitted into the insertion opening.

BRIEF DESCRIPTION OF THE DRAWINGS

Embodiment may be described in detail with reference to the accompanying drawings, in which.

DETAILED DESCRIPTION OF THE EMBODIMENTS

An embodiment of an electronic component mounting structure according to the invention will be described with reference to the accompanying drawings. As an electronic device applying the electronic component mounting structure according to the invention, a mobile terminal that has a card shape and can be operated by touching a display with a finger of a user, is exemplified.

Figure 1:
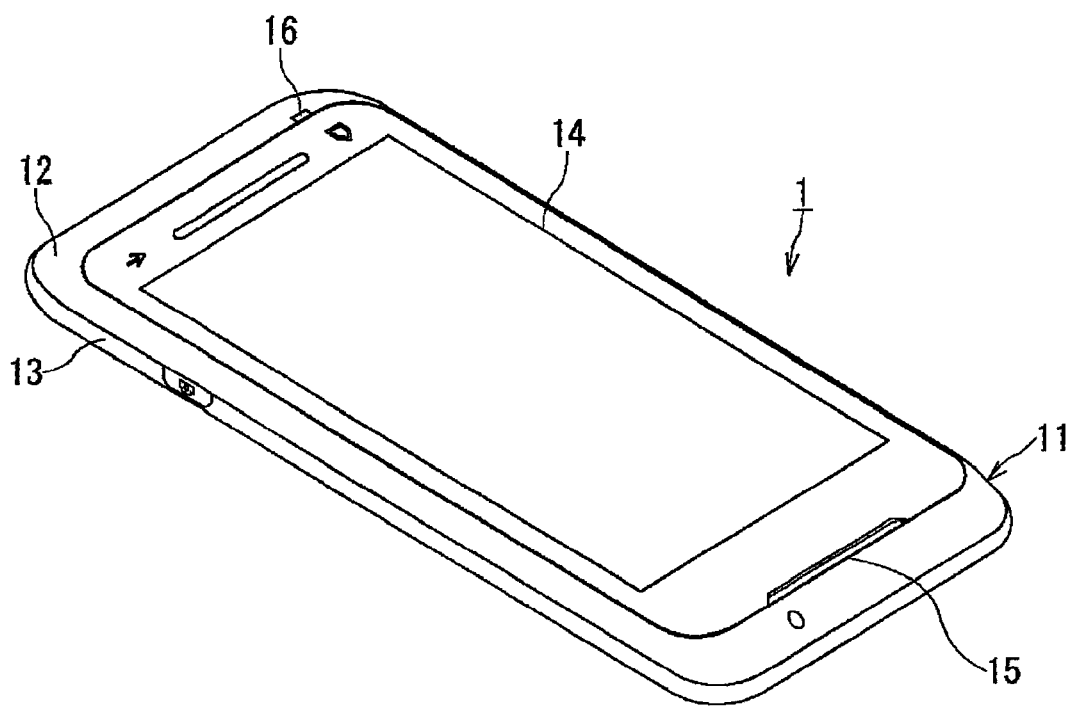
FIG. 1 is an exemplary perspective view illustrating a mobile terminal applying an electronic component mounting structure according to the invention.

FIG. 1 is a perspective view illustrating a mobile terminal applying the electronic component mounting structure according to the invention.

The mobile terminal 1 includes a casing 11 having a rectangular plate shape. The casing 11 is configured by joining a first casing 12 corresponding to a front side on which a touch screen 14 is provided and a second casing 13 corresponding to a rear side.

The touch screen 14 occupies most of the first casing 12. The touch screen 14 has both functions of a display provided with an area where a screen showing text or images is displayed, and an operating key having a touch sensor for receiving input that occurs when the display is contacted. The touch screen 14 includes a display configured as, for example, a Liquid Crystal Display (LCD). At a top of the display, plural elements for detecting contact with the surface of the display are arranged, and the transparent screen is stacked thereon. In addition, as a method of detecting contact with the touch screen 14, a resistive type for detecting change in pressure, a capacitive type for detecting an electrical signal by static electricity, and other methods may be applied.

In the casing 11, a receiver 15 for outputting sounds and a microphone 16 for inputting sounds are disposed.

Figure 2:
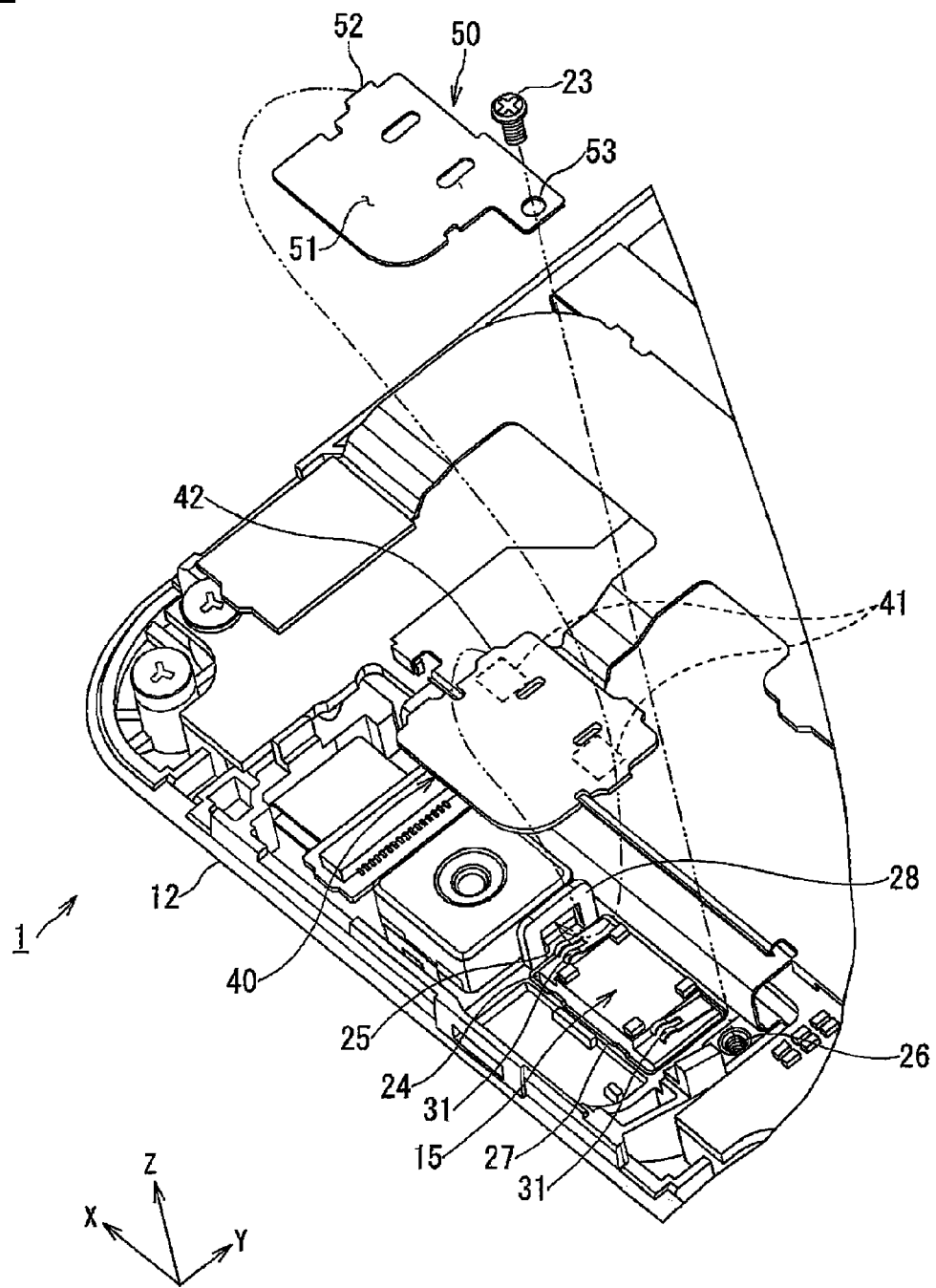
FIG. 2 is an exemplary view particularly showing a receiver of the mobile terminal, which is accommodated in a first casing.

FIG. 2 is a view particularly showing the receiver 15 of the mobile terminal 1, which is accommodated in the first casing 12. In FIG. 2, the receiver 15 is accommodated in the first casing 12, and a printed circuit board 40, a metal plate 50 for fixing, and a screw 23 are separated to be shown.

The first casing 12 is provided with an accommodating portion 24, an insertion opening 25, and a threaded hole 26.

The accommodating portion 24 is configured in the first casing 12 by allowing a rib 27 corresponding to the shape of the receiver 15 to protrude on the surface of the first casing 12.

The insertion opening 25 is configured by cutting the inside of a thin plate 28 into a rectangle having a predetermined size, the thin plate 28 standing in a thickness direction (Z-axis direction) of the mobile terminal 1 on the surface of the first casing 12. In addition, the insertion opening 25 is formed integrally with the outer periphery of the rib 27 of the accommodating portion 24 so as to be formed at the outside of the accommodating portion 24. In addition, the thin plate 28 maybe molded from resin of the first casing 12 as a part thereof, or from another resin to be attached to the first casing 12.

The threaded hole 26 is provided for fastening the screw 23 in the thickness direction (Z-axis direction) of the mobile terminal 1 so as to fix the metal plate 50 for fixing to the first casing 12. The threaded hole 26 is provided outside the accommodating portion 24. Specifically, the threaded hole 26 is provide data position substantially opposite to the insertion opening 25 with contact terminals 31 and 31 interposed there between when the receiver 15 is accommodated. In addition, the threaded hole 26 may be molded from the resin of the first casing 12 as a part thereof, or provided by burying a metal piece in the first casing 12.

The receiver 15 is an electronic component having two contact terminals 31 and 31 having elasticity. The receiver 15 is accommodated in the accommodating portion 24 such that a face for outputting sounds faces the front side (the outside of the mobile terminal 1) of the first casing 12 and the two contact terminals 31 and 31 face the rear side (the inside of the mobile terminal 1).

The printed circuit board 40 includes conductor layers 41 and 41 which come in contact with the contact terminals 31 and 31 of the receiver 15 for electrical connection. The printed circuit board 40 is a flexible printed circuit board and is connected to a main board (not shown) to receive various signals. The printed circuit board 40 is provided with a circuit board fitting claw 42 as a fitting part.

The circuit board fitting claw 42 is formed as a protrusion portion extending in a face direction from the printed circuit board 40 to a predetermined extent. The circuit board fitting claw 42 is fitted into the insertion opening 25 provided in a direction (X-axis direction) substantially perpendicular to the elasticity direction (Z-axis direction) of the contact terminals 31 and 31 when mounted to the casing 11.

The metal plate 50 for fixing is a thin metal plate as a fixing plate having a fixing face 51, a metal plate fitting claw 52, and a screw insertion hole 53.

The fixing face 51 has substantially the same shape as that of the printed circuit board 40. The fixing face 51 covers almost all of the printed circuit board 40 when mounted to the casing 11.

The metal plate fitting claw 52 has a protrusion portion extending in the face direction from the fixing face 51 to a predetermined extent. Like the circuit board fitting claw 42, the metal plate fitting claw 52 is fitted to the insertion opening 25 provided in the direction (X-axis direction) substantially perpendicular to the elasticity direction (Z-axis direction) of the contact terminals 31 and 31 when assembled.

The screw insertion hole 53 is a hole provided in a protrusion portion extending from the fixing face 51 in the face direction and also in the opposite direction to the metal plate fitting claw 52. When the screw insertion hole 53 is mounted to the casing 11, the screw 23 is inserted through the screw insertion hole 53 so that the metal plate 50 for fixing is fixed to the first casing 12.

Next, an operation of mounting the receiver 15 as the electronic component, the printed circuit board 40, and the metal plate 50 for fixing to the first casing 12 will be described.

Figure 3:
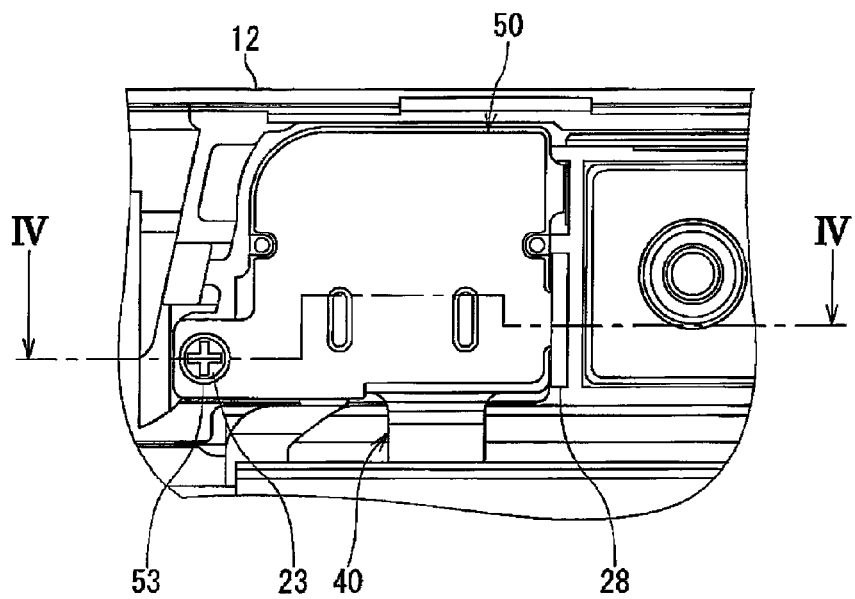
FIG. 3 is an exemplary partial enlarged view illustrating the first casing in which a receiver, a printed circuit board, and a metal plate for fixing are mounted.
Figure 4:
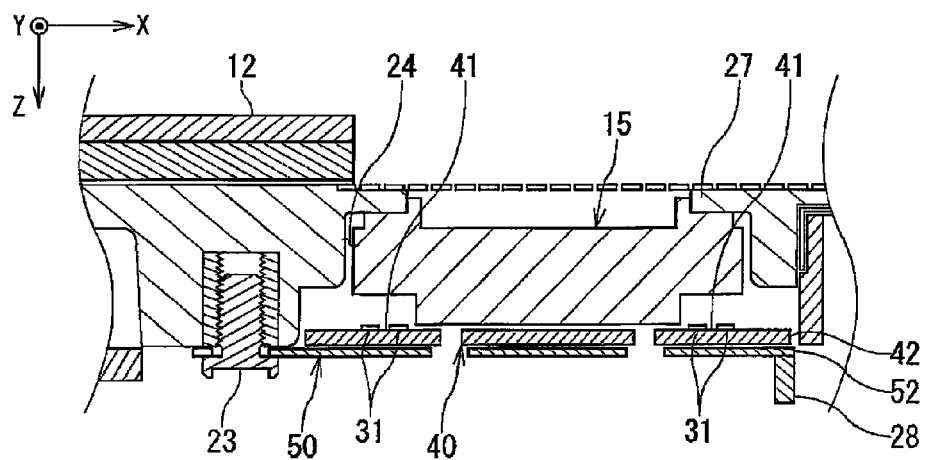
FIG. 4 is an exemplary sectional view taken along a line IV-IV of the first casing of FIG. 3.

FIG. 3 is a partial enlarged view illustrating the first casing 12 in which the receiver 15, the printed circuit board 40, and the metal plate 50 for fixing are mounted. FIG. 4 is a sectional view taken along the line IV- IV of the first casing 12 of FIG. 3.

First, the receiver 15 is accommodated in the accommodating portion 24 of the first casing 12. As the receiver 15 is accommodated in the accommodating portion 24 corresponding to the shape of the receiver 15, the movement of the receiver 15 in the face direction (X- and Y-axis directions) of the first casing 12 is fixed.

Next, the printed circuit board 40 is stacked on the receiver 15 by bringing the conductor layers 41 and 41 into contact with the contact terminals 31 and 31. When the printed circuit board 40 is simply placed on the receiver 15, it rises due to the contact pressure of the contact terminals 31 and 31 of the receiver 15. However, in this embodiment, the printed circuit board 40 having the circuit board fitting claw 42 can be temporarily fixed to the first casing 12 by fitting the circuit board fitting claw 42 into the insertion opening 25. The circuit board fitting claw 42 is fitted into the insertion opening 25 in the direction (X-axis direction) substantially in perpendicular to the elasticity direction (Z-axis direction) of the contact terminals 31 and 31.

The operation performed at this time is an operation of pushing the printed circuit board 40 in a connection direction (direction along the Z-axis) while checking that the contact terminals 31 and 31 and the conductor layers 41 and 41 are reliably in contact with each other, after checking that the circuit board fitting claw 42 is fitted into the insertion opening 25.

By temporarily fixing the printed circuit board 40, the operational burden when the metal plate 50 for fixing is subsequently stacked can be reduced. Here, the printed circuit board 40 is in a state where it rises from the circuit board fitting claw 42 as a fulcrum.

When the printed circuit board 40 is disposed, the metal plate 50 for fixing is stacked to fix the printed circuit board 40 in the connection direction of the contact of the contact terminals 31 and 31. The metal plate 50 for fixing is fixed to the first casing 12 temporarily by fitting the metal plate fitting claw 52 into the insertion opening 25. The metal plate fitting claw 52 is fitted into the insertion opening 25 in the direction (X-axis direction) substantially perpendicular to the elasticity direction (Z-axis direction) of the contact terminals 31 and 31.

The operation performed at this time is an operation of pushing the metal plate 50 for fixing in the connection direction (direction along the Z-axis) while checking whether or not the conductor layers 41 and 41 of the printed circuit board 40 are misaligned with the contact terminals 31 and 31, after checking that the metal plate fitting claw 52 is fitted into the insertion opening 25.

The circuit board fitting claw 42 and the metal plate fitting claw 52 are fitted into the insertion opening 25. In this case, any vacant space hardly exists in the insertion opening 25 in an inward direction (downward direction in the figure) of the casing 11 due to the circuit board fitting claw 42 and the metal plate fitting claw 52. Accordingly, the movement of the metal plate fitting claw 52 in the elasticity direction (Z-axis direction) is restricted by the reaction force from the thin plate 28 having the insertion opening 25. That is, the metal plate fitting claw 52 is in a state where it obtains a load facing the contact pressure of the contact terminals 31 and 31 of the receiver 15 at the thin plate 28 having the insertion opening 25.

A state where the printed circuit board 40 and the metal plate 50 for fixing are stacked on the receiver 15 can be maintained even though the person who performs the mounting operation is not required to push the metal plate 50 for fixing by hand, thereby enhancing operability.

After the metal plate 50 for fixing is temporarily fixed to the first casing 12, it is permanently fixed to the first casing 12 by the screw 23 inserted through the screw insertion hole 53. The screw 23 is fastened in the elasticity direction (direction along the Z-axis) of the contact terminals 31 and 31. The metal plate 50 for fixing is fixed to the first casing 12 by the screw insertion hole 53 disposed at a position substantially opposed to the insertion opening 25, through the insertion opening 25 formed at the outside of the accommodating portion 24 and the contact terminals 31 and 31, thereby reliably maintaining a contact state with the printed circuit board 40 and the receiver 15.

In the electronic component mounting structure, even in the case where the receiver 15 which has the contact terminals 31 and 31 with elasticity and which is unavoidably influenced by the contact pressure is mounted, it is possible to suitably reduce the influence of the contact pressure by temporarily fitting and fixing the fitting claws 42 and 52 of the printed circuit board 40 and the metal plate 50 for fixing to the insertion opening 25, respectively. Accordingly, it is possible to solve the difficulty in the fixing operation of the metal plate 50 for fixing due to the contact pressure of the contact terminals 31 and 31, and thus it is possible to reduce the operation time for mounting the receiver 15, the printed circuit board 40, and the metal plate 50 for fixing to the first casing 12.

In addition, in this mounting structure, the printed circuit board 40 and the metal plate 50 for fixing can be stacked on the receiver 15 by an operation for dropping them in the elasticity direction while checking the contact state of the contact terminals 31 and 31. Therefore, it is possible to avoid the deformation of the contact terminals 31 and 31 that may occur when the printed circuit board 40 and the metal plate 50 for fixing are misaligned during the mounting of the receiver 15.

In addition, since the deformation of the contact terminals 31 and 31 does not need to be considered, there is no need to consider the direction of the contact terminals 31 and 31 to determine the arrangement of the insertion opening 25 and the threaded hole 26. That is, as long as the contact state of the receiver 15 and the printed circuit board 40 is suitably maintained, the insertion opening 25 and the threaded hole 26 can be disposed freely, so that it is possible to minimize the limitations on the arrangement of the components.

Figure 5A:
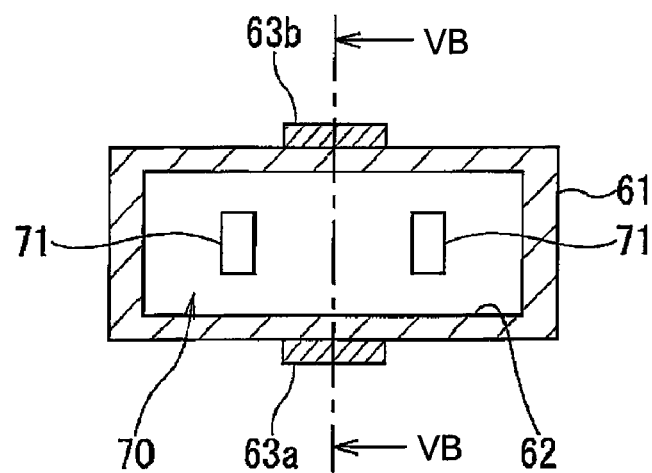
FIGS. 5A and 5B are views illustrating an example of a mounting structure as Comparative Example.
Figure 5B:
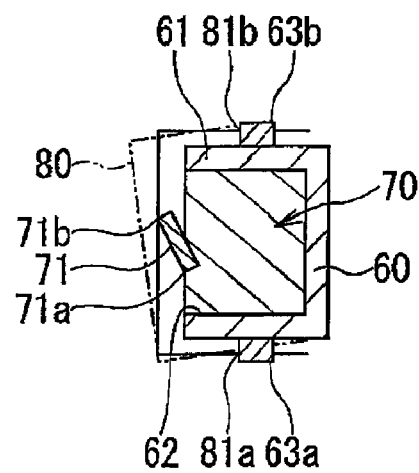

FIGS. 5A and 5B are views illustrating an example of another mounting structure as Comparative Example. FIG. 5A is a plan view of the mounting structure in the case where a receiver is accommodated, and FIG. 5B is a sectional view taken along the line VB-VB for explaining the case where a metal plate for fixing is mounted to the receiver of FIG. 5A. In FIGS. 5A and 5B, the printed circuit board is not shown for convenience of description.

In the mounting structure of the receiver 70 of FIGS. 5A and 5B, an accommodating portion 62 of the receiver 70 is configured by a rib 61 which stands on the surface of the casing 60 and corresponds to the shape of the receiver 70. The accommodating portion 62 is provided with two convex portions 63a and 63b at its outer periphery. A metal plate 80 for fixing is U-shaped to cover the walls of the rib 61, which are opposed to each other. The metal plate 80 for fixing is provided with mounting holes 81a and 81b at positions to be engaged with the convex portions 63a and 63b, respectively.

In order to reinforce the contact between the receiver 70 and the printed circuit board (not shown) by disposing the metal plate 80 for fixing, an operation for engaging the mounting hole 81a of the metal plate 80 for fixing with the convex portion 63a of one rib 61 is performed. Then, a state where the metal plate 80 for fixing covers the receiver 70 follows. Accordingly, in the state where it cannot be checked whether or not the contact state of the receiver 70 and the printed circuit board is correct, an operation for engaging the mounting hole 81b with the other convex portion 63b has to be performed.

Therefore, so as not to cause the deformation of the contact terminals 71 and 71 due to an unnecessarily high load that is exerted when the metal plate 80 for fixing is mounted, the arrangement of the convex portions 63a and 63b and the mounting holes 81a and 81b is automatically determined according to the direction of the contact terminals 71 and 71.

Specifically, for example, by initially disposing the convex portion 63a with which the mounting hole 81a of the metal plate 80 for fixing is to be engaged, on a side of a stationary end 71a of the contact terminal 71, and then disposing the convex portion 63b with which the mounting hole 81b of the plate 80 for fixing is to be engaged, on a side of a free end 71b of the contact terminal 71, the deformation of the contact terminal 71 that may occur during the mounting has to be considered.

Accordingly, in the mounting structure of FIGS. 5A and 5B, the arrangement of the convex portions 63a and 63b of the rib 61 is necessarily determined according to the arrangement direction of the receiver 70, and this means that the degree of freedom of the components is low. In addition, since the convex portions 63a and 63b are formed at the outer periphery of the rib 61, it causes an increase in component size.

On the contrary, in the mounting structure of the receiver 15 according to this embodiment, the insertion opening 25 and the threaded hole 26 can be arranged without considering the direction of the contact terminals 31 and 31, so that it is possible to increase the degree of freedom of the arrangement of the components. In addition, as in the mounting structure of FIGS. 5A and 5B, there is no need to provide the convex portions 63a and 63b at the periphery of the rib 27 configuring the accommodating portion 24, it is effective in that other electrical components can be disposed nearby. In addition, the threaded hole 26 can be used for co-fastening mounting components of the other electrical components disposed nearby, so that it is effective in suppressing an increase in the number of the components.

In addition, in this embodiment, as the fitting parts, the fitting claws 42 and 52 are provided to the printed circuit board 40 and the metal plate 50 for fixing. However, they may be provided only to the metal plate 50 for fixing. In this case, the insertion opening 25 is configured such that when the metal plate fitting claw 52 of the plate 50 for fixing is fitted into the insertion opening 25, hardly any vacant space exists in the insertion opening 25 in the inward direction of the casing 11 due to the metal plate fitting claw 52.

In addition, in this embodiment, the receiver 15 is the electronic component applied. However, any component including a contact terminal having elasticity besides the receiver 15 can be applied to a mounting structure for other electronic components (for example, a microphone, a speaker, and a vibrator).

In addition, as the fixing plate, a plate formed as a thin plate is applied. However, other materials (for example, resin) maybe applied as long as they have stiffness high enough to reinforce the contact pressure of the printed circuit board.

In addition, the electronic component mounting structure according to the invention is applied to the mobile terminal 1. However, it can be applied to a mounting structure for an electronic component of a mobile phone, a Personal Digital Assistant (PDA), a personal computer, a portable game machine, a portable music player, a portable video player, and other electronic devices.

What is claimed is:

1. An electronic component mounting structure comprising:
   a casing including an accommodating portion, an insertion opening formed at outside of the accommodating portion, and a threaded hole to which a screw is fastened;
   an electronic component including a contact terminal having elasticity;
   a printed circuit board including a conductor layer electrically connectable to the contact terminal and a board fitting portion configured to fit into the insertion opening; and
   a fixing plate including a plate fitting portion configured to fit into the insertion opening, and a screw insertion hole through which the screw is inserted, and configured to fix the printed circuit board to the casing in a connection direction of the contact terminal, wherein:
   in the accommodating portion, the fixing plate is disposed on the printed circuit board, and the printed circuit board is disposed on the electronic component,
   the fixing plate is fixed to the casing by the screw inserted through the screw insertion hole in a state where the plate fitting portion is fitted into the insertion opening, and
   both the board fitting portion and the plate fitting portion are fitted in the insertion opening with no vacant space in the insertion opening.

2. The electronic component mounting structure of claim 1, wherein:
   the insertion opening is configured so that the plate fitting portion is inserted into the insertion opening in a direction substantially perpendicular to an elasticity direction of the contact terminal, and
   the threaded hole is configured so that the screw is fastened to the threaded hole in the elasticity direction of the contact terminal.

3. The electronic component mounting structure of claim 1, wherein:
   the insertion opening is configured so that the board fitting portion is inserted into the insertion opening in a direction substantially perpendicular to an elasticity direction of the contact terminal, and
   the threaded hole is configured so that the screw is fastened to the threaded hole in the elasticity direction of the contact terminal.

4. The electronic component mounting structure of claim 1, wherein the insertion hole and the threaded hole are substantially opposed to each other with respect to the contact terminal.

5. The electronic component mounting structure of claim 1, wherein the insertion hole and the threaded hole are substantially opposed to each other with respect to the contact terminal.

6. The electronic component mounting structure of claim 2, wherein the insertion hole and the threaded hole are substantially opposed to each other with respect to the contact terminal.

7. The electronic component mounting structure of claim 3, wherein the insertion hole and the threaded hole are substantially opposed to each other with respect to the contact terminal.

8. An electronic device comprising:
   a casing including an accommodating portion, an insertion opening formed at outside of the accommodating portion, and a threaded hole to which a screw is fastened;
   an electronic component including a contact terminal having elasticity;
   a printed circuit board including a conductor layer electrically connectable to the contact terminal and a board fitting portion configured to fit into the insertion opening; and
   a fixing plate including a plate fitting portion configured to fit into the insertion opening, and a screw insertion hole through which the screw is inserted, and configured to fix the printed circuit board to the casing in a connection direction of the contact terminal, wherein:
   in the accommodating portion, the fixing plate is disposed on the printed circuit board, and the printed circuit board is disposed on the electronic component,
   the fixing plate is fixed to the casing by the screw inserted through the screw insertion hole in a state where the plate fitting portion is fitted into the insertion opening, and
   both the board fitting portion and the plate fitting portion are fitted in the insertion opening with no vacant space in the insertion opening.

9. The electronic device of claim 8, wherein:
   the insertion opening is configured so that the plate fitting portion is inserted into the insertion opening in a direction substantially perpendicular to an elasticity direction of the contact terminal, and
   the threaded hole is configured so that the screw is fastened to the threaded hole in the elasticity direction of the contact terminal.

10. The electronic device of claim 8, wherein:
    the insertion opening is configured so that the board fitting portion is inserted into the insertion opening in a direction substantially perpendicular to an elasticity direction of the contact terminal, and
    the threaded hole is configured so that the screw is fastened to the threaded hole in the elasticity direction of the contact terminal.

11. The electronic device of claim 8, wherein the insertion hole and the threaded hole are substantially opposed to each other with respect to the contact terminal.

12. The electronic device of claim 8, wherein the insertion hole and the threaded hole are substantially opposed to each other with respect to the contact terminal.

13. The electronic device of claim 10, wherein the insertion hole and the threaded hole are substantially opposed to each other with respect to the contact terminal.

14. The electronic device of claim 11, wherein the insertion hole and the threaded hole are substantially opposed to each other with respect to the contact terminal.

15. A manufacturing method of an electronic device, wherein the electronic device has: a casing including an accommodating portion, an insertion opening formed at outside of the accommodating portion, and a threaded hole to which a screw is fastened; an electronic component including a contact terminal having elasticity; a printed circuit board including a conductor layer electrically connectable to the contact terminal and a board fitting portion configured to fit into the insertion opening; and a fixing plate including a plate fitting portion configured to fit into the insertion opening, and a screw insertion hole through which the screw is inserted, and configured to fix the printed circuit board to the casing in a connection direction of the contact terminal, the manufacturing method comprising:

disposing the electronic component in the accommodating portion;

disposing the printed circuit board on the electronic component;

disposing the fixing plate on the printed circuit board; and fixing the fixing plate to the casing by the screw inserted through the screw insertion hole in a state where the plate fitting portion is fitted into the insertion opening, wherein both the board fitting portion and the plate fitting portion are fitted in the insertion opening with no vacant space in the insertion opening.

* * * * *